(12) United States Patent
Chen

(10) Patent No.: US 7,190,207 B2
(45) Date of Patent: Mar. 13, 2007

(54) ONE WAY CONDUCTOR

(75) Inventor: Sheng-Feng Chen, Taipei Shien (TW)

(73) Assignee: Quanta Computer, Inc., Tao Yuan Shien (TW)

( * ) Notice: Subject to any disclaimer, the term of this patent is extended or adjusted under 35 U.S.C. 154(b) by 62 days.

(21) Appl. No.: 11/092,690

(22) Filed: Mar. 30, 2005

(65) Prior Publication Data

US 2005/0253642 A1    Nov. 17, 2005

(30) Foreign Application Priority Data

May 14, 2004    (TW) .............................. 93113765 A

(51) Int. Cl.
*H03K 17/00*    (2006.01)
(52) U.S. Cl. ..................... 327/365; 327/387
(58) Field of Classification Search ............. 327/308, 327/365, 376, 377, 432–434, 387
See application file for complete search history.

(56) References Cited

U.S. PATENT DOCUMENTS

| | | | | |
|---|---|---|---|---|
| 5,517,379 A * | 5/1996 | Williams et al. | .............. | 361/84 |
| 6,469,564 B1 * | 10/2002 | Jansen | .................. | 327/365 |
| 6,552,599 B1 * | 4/2003 | Xu | .............. | 327/493 |
| 6,781,441 B2 * | 8/2004 | Mori | .................. | 327/538 |
| 6,815,940 B2 * | 11/2004 | Nakashimo | ................. | 323/288 |
| 6,870,417 B2 * | 3/2005 | Mercier | ................ | 327/493 |
| 7,009,314 B2 * | 3/2006 | Chen | .................. | 307/130 |

* cited by examiner

*Primary Examiner*—Timothy P. Callahan
*Assistant Examiner*—Hai L. Nguyen
(74) *Attorney, Agent, or Firm*—Rabin & Berdo P.C.

(57) ABSTRACT

A one way conductor includes a MOSFET and a driving device. The MOSFET has a source and a drain respectively serving a positive end P and a negative end N of the one way conductor. The driving device including a BJT differential amplifier detects a voltage difference between the source and the drain of the MOSFET. When the voltage of the positive end P is higher than the voltage of the negative end N, the driving device outputs a driving voltage to a gate of the MOSFET to turn on the MOSFET. If the voltage of the positive end P is lower than the voltage of the negative end N, the driving device cannot output the driving voltage for turning on the MOSFET, and the one way conductor is turned off at this time. Consequently, the one way conductor of the invention has the one way conductive property.

7 Claims, 6 Drawing Sheets

ONE WAY CONDUCTOR

This application claims the benefit of Taiwan application Serial No. 93113765, filed May 14, 2004, the subject matter of which is incorporated herein by reference.

BACKGROUND OF THE INVENTION

1. Field of the Invention

The invention relates in general to a one way conductor, and more particularly to a one way conductor having a low forward voltage.

2. Description of the Related Art

A diode is one of the indispensable components among various electronic components required by the electronic circuit. However, the diode always has a drawback that the forward voltage (VF) of the diode is not 0V but is about 0.6V. For example, a Schottky diode has a forward voltage of about 0.4V, which may be obtained by changing the semiconductor manufacturing process. Although the Schottky diode can satisfy the requirements in designing most of the circuits, it still cannot satisfy the design of the special circuit, which requires the one way conductive property of the diode and must have a relatively low forward voltage. Thus, there is a need to develop a one way conductor having a very low forward voltage so as to reduce the power loss of the circuit and enhance the efficiency of power usage.

FIG. 5 shows a conventional power supply circuit 500 using a diode. The battery BT1 and the battery BT2 provide the power for the load RL, which is, for example, a notebook computer. When the potential of the battery BT1 is higher than that of the battery BT2, the diode D1 is turned on and the diode D2 is turned off because the diode D1 is forward biased and the diode D2 is backward biased. The load RL can access the power supply voltage from the battery BT1 with the higher potential. On the contrary, if the potential of the battery BT1 is lower than that of the battery BT2, the load RL can access the power supply voltage from the battery BT2 with the higher potential. Because the diodes D1 are D2 are typical diodes, the voltage of the load RL is substantially 0.45V lower than the power supply voltage of the battery BT1 or BT2.

SUMMARY OF THE INVENTION

It is therefore an object of the invention to provide a one way conductor using a MOSFET and a BJT differential amplifier such that the one way conductor has the one way conductive property with a relatively low forward voltage.

The invention achieves the above-identified object by providing a one way conductor, which includes a first transistor and a driving circuit. The first transistor has a source, a drain and a gate. The driving circuit is coupled to the first transistor and includes a second transistor, a third transistor, a first impedance, a second impedance and a third impedance. The second transistor has a second emitter, a second base and a second collector. The third transistor has a third emitter, a third base and a third collector. The third emitter is coupled to the source, the third collector is coupled to the gate, the second base is coupled to the third base, and the second base is coupled to the second collector. The first impedance has a first end coupled to the drain and a second end coupled to the second emitter. The second impedance has a first end coupled to the second collector and a second end coupled to a constant voltage. The third impedance has a first end coupled to the third collector and a second end coupled to the constant voltage.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
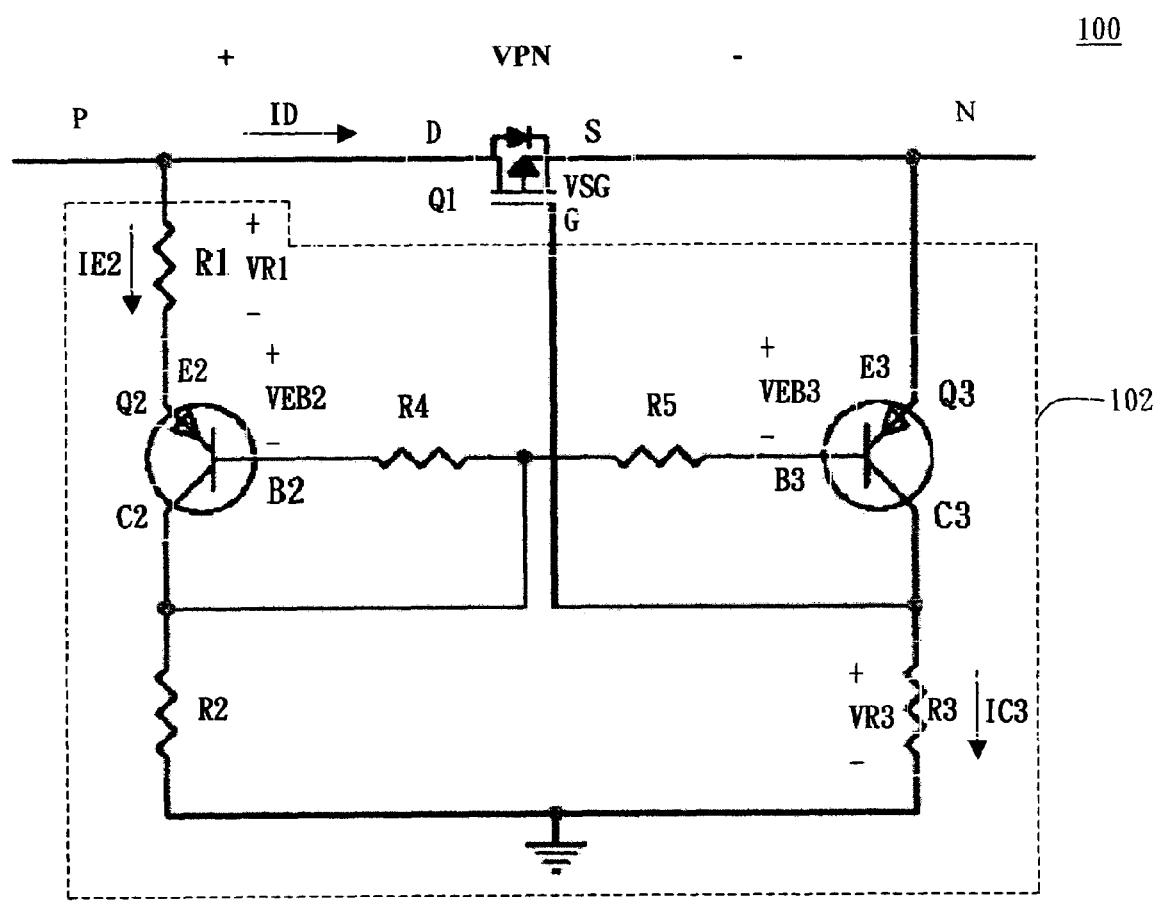
FIG. 1 shows a one way conductor according to a first embodiment of the invention.

FIG. 1 shows a one way conductor 100 according to a first embodiment of the invention. The one way conductor 100 utilizes a MOSFET Q1 and a driving device 102 such that the one way conductor 100 has the one way conductive property with a relatively low forward voltage. The one way conductor 100 includes a MOSFET Q1, a PNP bipolar junction transistor (BJT) transistor Q2, a PNP BJT transistor Q3 and resistors R1, R2, R3, R4 and R5. The MOSFET Q1 is a P channel transistor (i.e., PMOS) having a source S and a drain D respectively serving as an negative end N and a positive end P of the one way conductor 100. The transistors Q2 and Q3 constitute a BJT differential amplifier. The base B2 of the transistor Q2 is coupled to the collector C2 of the transistor Q2 through the resistor R4. The base B3 of the transistor Q3 is coupled to the collector C2 of the transistor Q2 through the resistor R5. The collector C2 of the transistor Q2 and the collector C3 of the transistor Q3 are respectively grounded through the resistors R2 and R3. The collector C3 of the transistor Q3 is coupled to the gate G of the PMOS transistor Q1, and the emitter E3 of the transistor 03 is coupled to the source S of the PMOS transistor Q1. A first end of the resistor R1 is coupled to the drain D of the transistor Q1, and a second end of the resistor R1 is coupled to the emitter E2 of the transistor Q2. The resistances of the resistors R2 and R3 are substantially the same, and the resistance of the resistor R2 is far greater than that of the resistor R1. Preferably, the resistance of the resistor R2 is several hundred times that of the resistance of the resistor R1.

The operation principle of the one way conductor 100 will be described detailedly in the following. When the one way conductor 100 is forward biased, the voltage of the positive end P is higher than that of the negative end N, and a static current IE2 flows through the transistor Q2. After the static current IE2 flows through the resistor R1, a cross-over voltage VR1 between two ends of the resistor R1 is generated. The cross-over voltage VR1 is preferably several tens of millivolts (mV). When the voltage of the P terminal rises such that the voltage difference between the P terminal and the N terminal is higher than VR1, the voltage of the emitter E2 of the transistor Q2 rises with the rise of the voltage of the P terminal. Because the resistance of the resistor R2 is very large, the static current IE2 of the transistor Q2 is almost kept constant although the voltage of the P terminal rises. Thus, the VEB2 (the cross-over voltage between the emitter E2 and the base B2) of the transistor Q2 is almost kept constant, too. Because the voltage of the emitter E2 of the transistor Q2 rises with the rise of the voltage of the P terminal, the voltage of the base B2 of the transistor Q2 also rises with the rise of the voltage of the emitter E2 of the transistor Q2. Consequently, the voltage of the base B3 of the transistor Q3 also rises with the rise of the voltage of the base B2 of the transistor Q2. However, because the voltage of the negative end N of the one way conductor 100 is kept constant, the voltage of the emitter E3 of the transistor Q3 is also kept constant. Thus, the VEB3 (the cross-over voltage between the emitter E3 and the base B3) of the transistor Q3 decreases. Consequently, the current IC3 flowing through the collector C3 of the transistor Q3 decreases such that the cross-over voltage VR3 of the resistor R3 decreases. Accordingly, the voltage of the collector C3 of the transistor Q3 decreases. When the voltage of the collector C3 of the transistor Q3 decreases such that the VSG (the cross-over voltage between the source S and the gate G) of the transistor Q1 is greater than an absolute value of a threshold voltage Vth of the transistor Q1, the transistor Q1 is turned on and the forward current ID flows from the positive end P to the negative end N.

On the contrary, when the voltage of the negative end N is higher than that of the positive end P, the voltage of the emitter E3 of the transistor Q3 is higher than that of the emitter E2 of the transistor Q2, and the transistor Q3 is turned on accordingly. The collector C3 of the transistor Q3 has a high voltage such that the transistor Q1 is completely turned off. Thus, the one way conductor 100 is backward biased and the one way conductor 100 is turned off. When the voltage difference between the negative end N and the positive end P is higher than the VEB2 of the transistor Q2, a backward current flows from the negative end N to the source B3 of the transistor Q3 through the emitter E3 of the transistor Q3, then flows to the base B2 of the transistor Q2 through the resistors R5 and R4, then flows through the emitter E2 of the transistor Q2 and the resistor R1, and finally flows to the positive end P. The existing resistors R4 and R5 can reduce the backward current. If each of the transistor Q2 and the transistor Q3 has the VEB voltage higher than the highest voltage of the negative end N, the resistors R4 and R5 can be omitted in the one way conductor 100 of this embodiment, and the bases B2 and B3 of the transistors Q2 and Q3 may be directly and electrically connected to each other.

Figure 2:
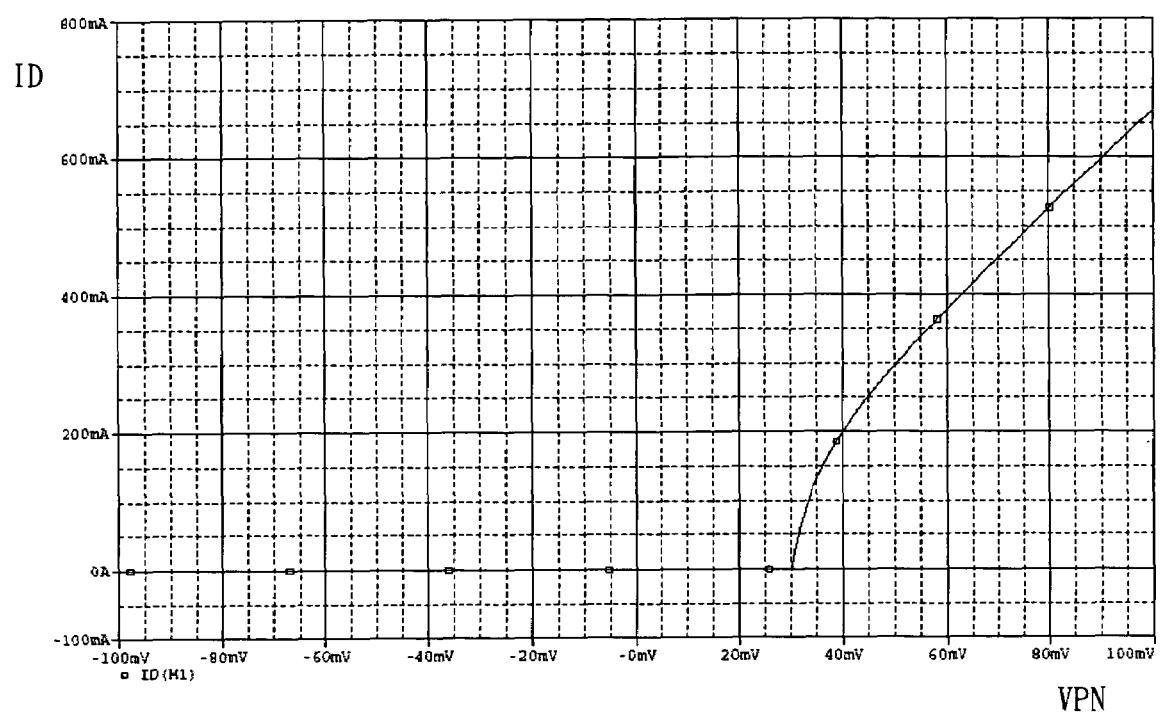
FIG. 2 shows a Pspice simulation result.
Figure 3:
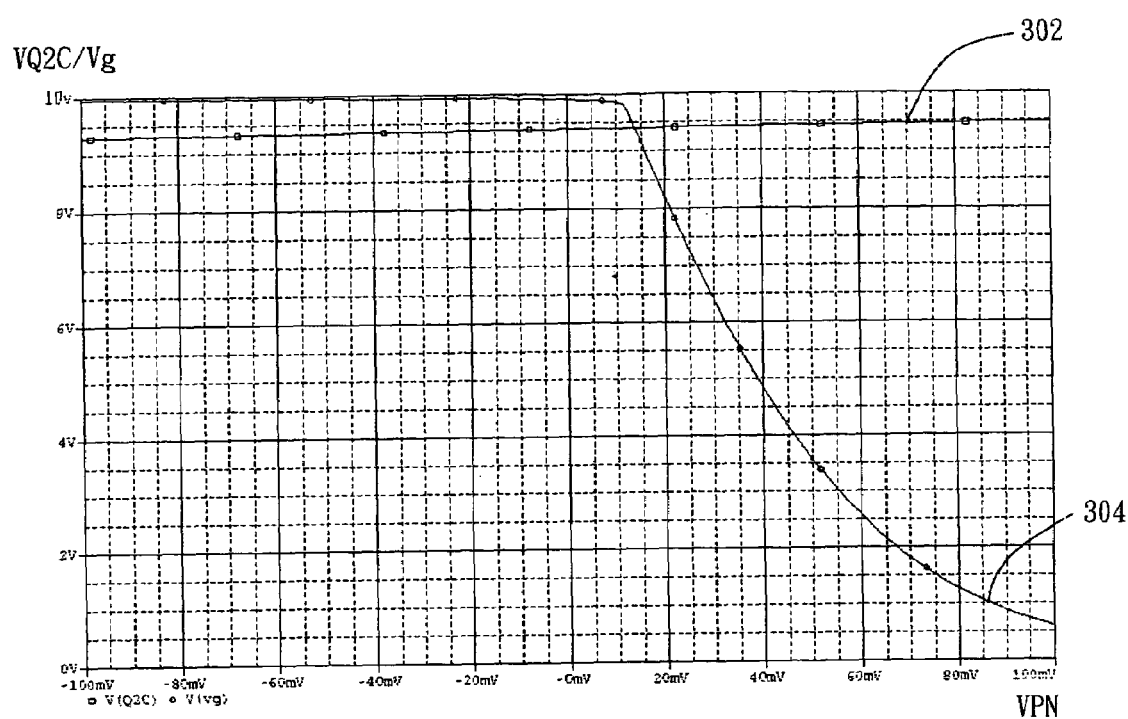
FIG. 3 shows other Pspice simulation results.

The first embodiment of the invention will be further described with reference to various resistances in conjunction with PSpice simulation results. FIG. 2 shows a Pspice simulation result of the relation of the voltage difference VPN between the positive end P and the negative end N of the one way conductor 100 and the forward current ID, and FIG. 3 shows Pspice simulation results of the relation of the VPN and the voltage VQ2C (curve 302) of the collector C2 of the transistor Q2 and a voltage Vg (curve 304) of the gate G of the transistor Q1 when the voltage of the negative end N of the one way conductor 100 is a constant of 10V, the resistor R1 is 1.5K Ohms, the resistors R4 and R5 are 100K Ohms, and the resistors R2 and R3 are 1M Ohms. As shown in FIG. 2, the horizontal axis represents the voltage difference VPN between the positive end P and the negative end N, and the vertical axis represents the forward current ID. In FIG. 2, when VPN equals 30 mV, the transistor Q1 is turned on. After the transistor Q1 is turned on, the value of the voltage Vg and the slope of the forward bias VPN V.S. the forward current ID are determined by the common emitter current gain β of Q3. As shown in FIG. 3, when the voltage Vg equals the voltage VQ2C of the collector C of the transistor Q2, Vg and VQ2C substantially equal the cross-over voltage VR1 of the resistor R1, and VR1 is substantially equal to (VP−VBE2)×(R1/(R1+R2))=(10−0.6)×(1.5 k/(1.5 k+1000 k))=14 mV, wherein VP is the voltage of the positive end P. The voltage Vg of the gate G of the transistor Q1 decreases with the increase of the VPN.

In this case, when the forward current ID is smaller than 0.2 amperes, the transistor Q1 is not completely turned on. The impedance of the transistor Q1 increases with the decrease of the forward current ID. When the forward current ID is zero, the transistor Q1 is completely turned off. The actual curve of the forward current ID of FIG. 2 is determined according to the property of the transistor Q1.

Each of the transistors Q2 and Q3 is preferably a twin transistor such that the transistors Q2 and Q3 have similar but not completely the same properties and parameters. In order to disable the one way conductor 100 from generating a backward current, the forward voltage of the one way conductor 100 when the conductor 100 is turned on has to be greater than the offset voltage of the transistors Q2 and Q3. The value of the forward voltage can be determined according to the resistance value of the resistor R1 and the threshold voltage of the gate G of the transistor Q1. The larger the resistance value of the resistor R1 is, the larger the forward voltage is. The smaller the resistance value of the resistor R1 is, the smaller the forward voltage is. Thus, it is possible to change the forward voltage of the one way conductor 100 when the conductor 100 is turned on by adjusting the resistance value of the resistor R1.

Figure 4:
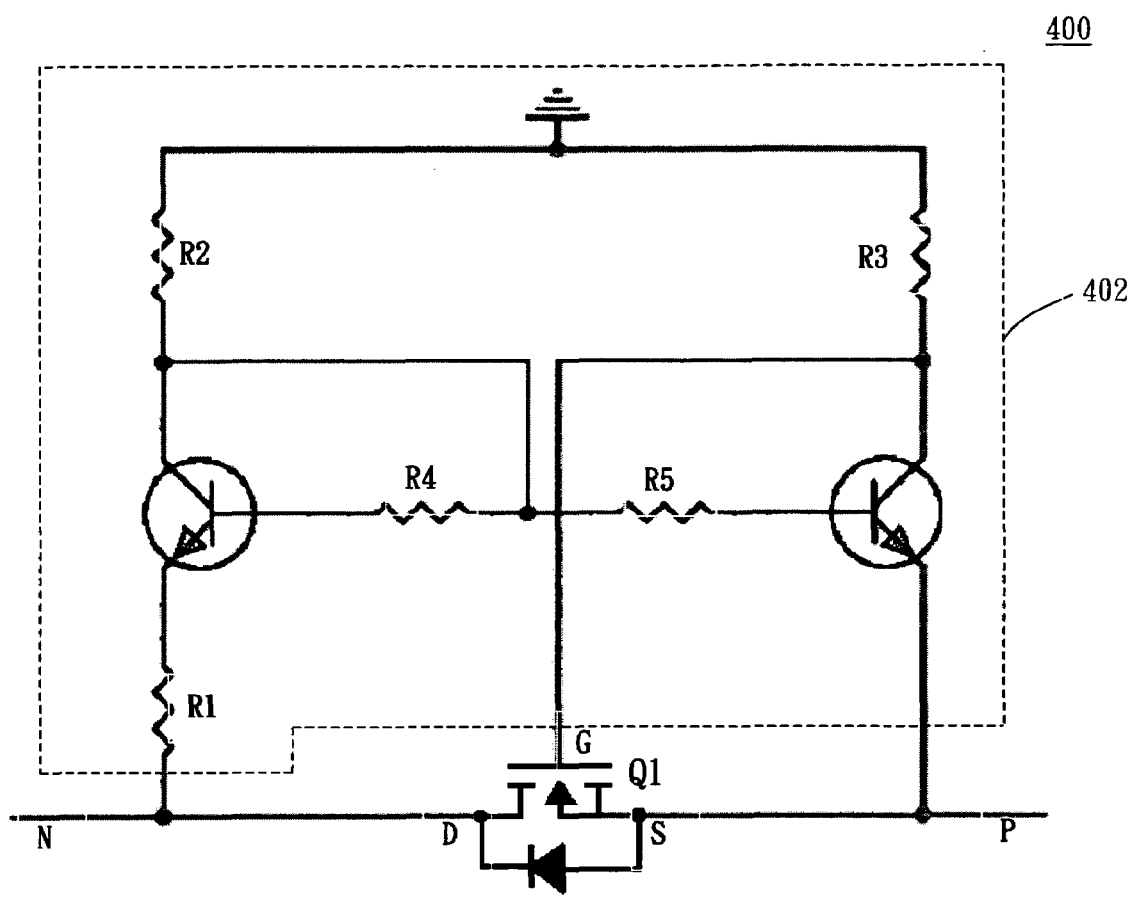
FIG. 4 shows a one way conductor according to a second embodiment of the invention.

FIG. 4 shows a one way conductor 400 according to a second embodiment of the invention. The one way conductor 400 includes an N channel MOSFET Q1 (NMOS) and a driving device 402. The transistor Q1 has a source S and a drain D respectively serving as a positive end P and a negative end N of the one way conductor. The configuration and principle of the one way conductor 400 are similar to those of the one way conductor 100 of FIG. 1. The one way conductor 400 may be obtained by replacing the P channel transistor Q1 of the one way conductor 100 with an N channel transistor and replacing the PNP transistors Q2 and Q3 with NPN transistors.

Figure 5:
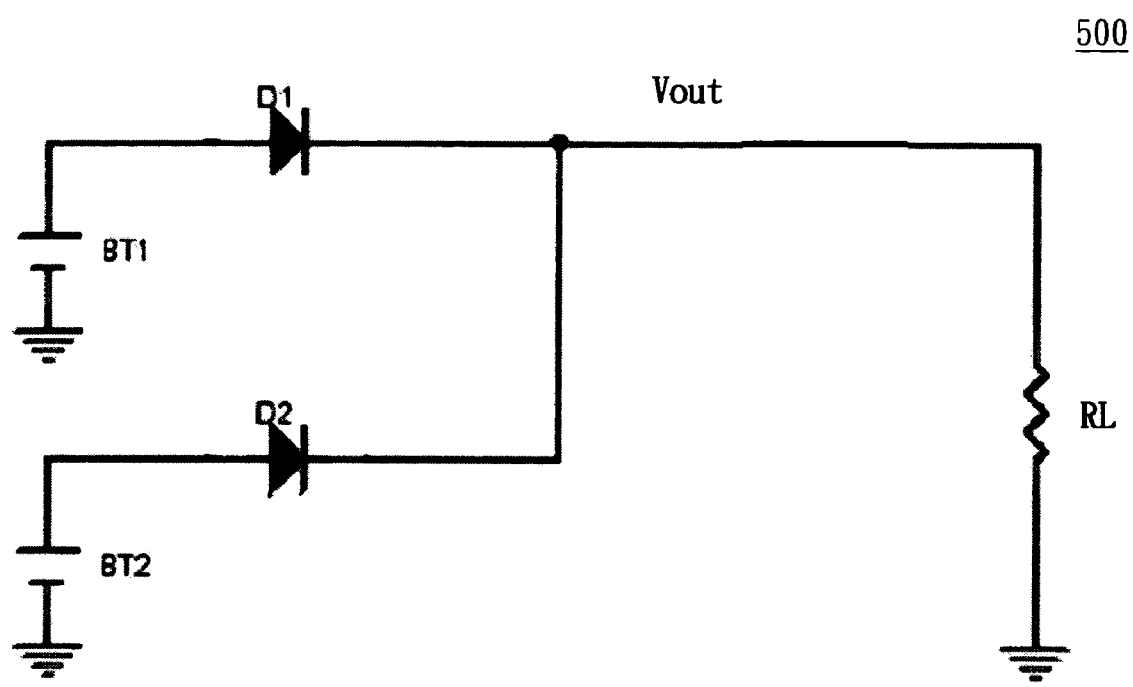
FIG. 5 shows a conventional power supply circuit using a diode.
Figure 6:
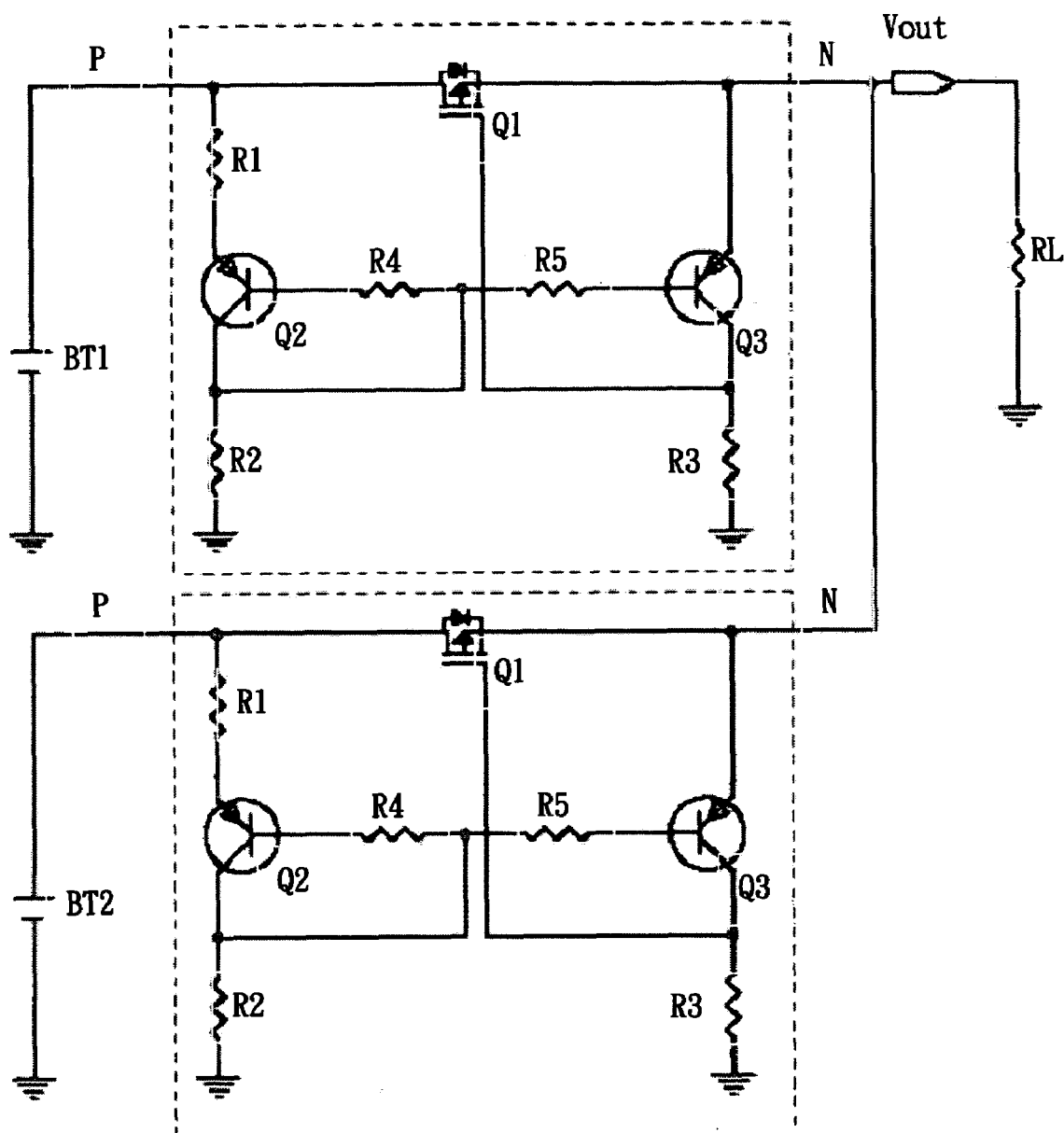
FIG. 6 shows a power supply circuit using the one way conductor of the invention.

FIG. 6 shows a power supply circuit 600 using the one way conductor 100 of the invention. When the one way conductor 100 of the first embodiment of the invention is applied to the power supply circuit 600, the voltage of the load RL is only several tens of mV lower than the power supply voltage of the battery BT1 or BT2, and the voltage drop of the several tens of mV is far smaller than that in the power supply circuit 500 using the typical diode, as shown in FIG. 5.

The one way conductors according to the embodiments of the invention have the following advantages.

1. The forward voltage is very low.
2. The backward leakage current is lower than that of the Schottky diode.
3. The forward conductive and backward cut-off operations are very precise without the generation of the large backward current.
4. When the one way conductor is converted from the forward bias into the backward bias, the forward saturation region of the MOSFET is converted into the working region and then into the backward cut-off region in a gradually manner. So, when the voltage difference between the positive end P and the negative end N of the one way conductor approaches zero volts, the one way conductor of the invention is free from the unstable oscillating phenomenon.

5. The efficiency can be enhanced when the one way conductor of the invention is used in a rectification circuit.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A one way conductor, comprising:
   a first transistor, having a source, a drain and a gate; and
   a driving circuit, the driving circuit being coupled to the first transistor and comprising:
   a second transistor having a an emitter, a base and a collector;
   a third transistor having an emitter, a base and a collector, wherein the emitter of the third transistor is coupled to the source of the first transistor, the collector of the third transistor is coupled to the gate of the first transistor, the base of the second transistor is coupled to the base of the third transistor, and the base of the second transistor is coupled to the collector of the second transistor;
   a first impedance element having a first end coupled to the drain of the first transistor and a second end coupled to the emitter of the second transistor;
   a second impedance element having a first end coupled to the collector of the second transistor and a second end coupled to a constant voltage; and
   a third impedance element having a first end coupled to the collector of the third transistor and a second end coupled to the constant voltage.

2. The one way conductor according to claim 1, wherein the second impedance element has an impedance that is substantially equal to the impedance of the third impedance element.

3. The one way conductor according to claim 2, wherein the driving circuit further comprises:
   a fourth impedance element, through which the base of the second transistor is coupled to the collector of the second transistor; and
   a fifth impedance element, through which the base of the third transistor is coupled to the collector of the second transistor.

4. The one way conductor according to claim 3, wherein the first transistor is a P channel MOSFET, and each of the second transistor and the third transistor is a PNP type bipolar junction transistor.

5. The one way conductor according to claim 3, wherein the first transistor is an N channel MOSFET, and each of the second transistor and the third transistor is a NPN type bipolar junction transistor.

6. The one way conductor according to claim 1, wherein a forward voltage of the one way conductor relates to a ratio of the first impedance element to the second impedance element.

7. The one way conductor according to claim 1, wherein the constant voltage is ground voltage.

* * * * *